United States Patent
Igarashi

(10) Patent No.: US 7,935,432 B2
(45) Date of Patent: *May 3, 2011

(54) ORGANIC ELECTROLUMINESCENT DEVICE

(75) Inventor: Tatsuya Igarashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 753 days.

This patent is subject to a terminal disclaimer.

(21) Appl. No.: 10/572,095

(22) PCT Filed: Sep. 17, 2004

(86) PCT No.: PCT/JP2004/014011
§ 371 (c)(1),
(2), (4) Date: Mar. 16, 2006

(87) PCT Pub. No.: WO2005/029606
PCT Pub. Date: Mar. 31, 2005

(65) Prior Publication Data
US 2007/0122651 A1    May 31, 2007

(30) Foreign Application Priority Data
Sep. 19, 2003  (JP) ................................ 2003-327633

(51) Int. Cl.
*H01L 51/54* (2006.01)

(52) U.S. Cl. ........ 428/690; 428/917; 313/504; 313/506; 257/E51.001; 257/E51.052

(58) Field of Classification Search .................. 428/690, 428/917; 313/502–509; 257/40, 88–103, 257/E51.001–E51.052
See application file for complete search history.

(56) References Cited

U.S. PATENT DOCUMENTS

| | | | |
|---|---|---|---|
| 5,698,858 A | 12/1997 | Borner | |
| 5,756,224 A | 5/1998 | Borner et al. | |
| 5,861,219 A | 1/1999 | Thompson et al. | |
| 6,310,360 B1 * | 10/2001 | Forrest et al. | 257/40 |
| 6,582,875 B1 | 6/2003 | Kay et al. | |
| 7,011,897 B2 * | 3/2006 | Thompson et al. | 428/690 |
| 2002/0024293 A1 * | 2/2002 | Igarashi et al. | 313/483 |
| 2002/0028329 A1 * | 3/2002 | Ise et al. | 428/336 |
| 2002/0096995 A1 | 7/2002 | Mishima et al. | |
| 2002/0125818 A1 | 9/2002 | Sato et al. | |
| 2002/0146589 A1 * | 10/2002 | Akiyama et al. | 428/690 |
| 2003/0218418 A9 | 11/2003 | Sato et al. | |
| 2005/0142383 A1 * | 6/2005 | Igarashi et al. | 428/690 |
| 2005/0158582 A1 * | 7/2005 | Ise et al. | 428/690 |
| 2005/0164032 A1 * | 7/2005 | Ise et al. | 428/690 |
| 2005/0214575 A1 * | 9/2005 | Igarashi et al. | 428/690 |
| 2006/0192482 A1 * | 8/2006 | Igarashi et al. | 313/504 |
| 2007/0122651 A1 | 5/2007 | Igarashi | |

FOREIGN PATENT DOCUMENTS

| | | |
|---|---|---|
| DE | 44 28 450 A1 | 2/1996 |
| EP | 1 175 128 A2 | 1/2002 |
| KR | 2003-0019897 A | 3/2003 |
| KR | 2003-0055140 A | 7/2003 |
| WO | WO-00/70655 A2 | 11/2000 |
| WO | WO-01/08230 A1 | 2/2001 |
| WO | WO-01/91203 A2 | 11/2001 |

OTHER PUBLICATIONS

Brooks et al, "Synthesis and Characterization of Phosphorescent Cyclometalated Platinum Complexes," vol. 41, No. 12, pp. 3055-3066, Jun. 2002.*
D'Andrade et al., Applied Physics Letters, American Institute of Physics, New York, US, vol. 79, No. 7, Aug. 13, 2001, pp. 1045-1047.
Korean Application No. 2006-7005324; Notice of Submission of Opinion; Sep. 16, 2010; 4 pages.

* cited by examiner

Primary Examiner — D. Lawrence Tarazano
Assistant Examiner — Camie S Thompson
(74) Attorney, Agent, or Firm — Birch, Stewart, Kolasch & Birch, LLP

(57) ABSTRACT

The organic electroluminescent device of the present invention has at least one organic compound layer containing a light-emitting layer between an anode and a cathode. The organic compound layer contains a fluorescent light-emitting compound emitting fluorescence at a time that voltage is applied and an amplifying agent. A phosphorescent light-emitting maximum wavelength of the amplifying agent is 500 nm or less, and the light emission at a time that voltage is applied is derived mainly from light emission of a fluorescent compound. In order to amplify intensity of emission at a time that voltage is applied It is preferable that the amplifying agent be capable of amplifying the number of singlet excitons generated at a time that voltage is applied.

22 Claims, No Drawings

ORGANIC ELECTROLUMINESCENT DEVICE

BACKGROUND OF THE INVENTION

1. Technical Field

The present invention relates to a light-emitting device capable of converting electric energy to light, and of emitting light, and particularly to an organic electroluminescent device ("light-emitting device" or "EL device") which can be used to advantage in fields such as display devices, displays, backlights, light sources for illumination, light sources for recording, light sources for exposure, light sources for reading, signs, signboards, interior decorations and optical communications.

2. Related Art

Organic electroluminescent (EL) devices have been attracting attention as promising display devices for obtaining luminescence of a high luminance at a low driving voltage. An important characteristic value of an organic electroluminescent device is external quantum efficiency. External quantum efficiency is calculated by "external quantum efficiency $\phi$=number of photons discharged from a device/number of electrons injected into a device". The higher the value of external quantum efficiency, the lower the power consumption of the device, and thereby a device having a higher value of external quantum efficiency is advantageous.

The external quantum efficiency of the organic electroluminescent device is also determined by "external quantum efficiency $\phi$=internal quantum efficiency×light extraction efficiency". In an organic EL device which uses fluorescence from an organic compound, the limit value of the external quantum efficiency is considered to be about 5% since the limit value of internal quantum efficiency is 25% and light extraction efficiency is about 20%.

A device which uses a triplet light-emitting material (phosphorescent light emitting material) has been reported as a method for improving the external quantum efficiency of the device by enhancing the internal quantum efficiency of the organic electroluminescent device (for instance, see WO 00/70655). In comparison with a conventional device using fluorescence (singlet light-emitting device), this device can enhance external quantum efficiency and a maximum value of external quantum efficiency of 8% has been attained (external quantum efficiency at 100 cd/m² is 7.5%). However, since a phosphorescent light emission from a heavy atomic metal complex is used, the response of light emission has been slow, and an improvement in durability also remains to be desired.

A singlet light-emitting device that uses energy translation from triplet excitons to singlet excitons has been reported as a method for alleviating this problem (for instance, see WO 01/8230). However, the device described therein has low efficiency, and the color of light emission is imited to red. There is, therefore, a need for a further improvements to the device.

It is accordingly an object of the present invention to provide an organic electroluminescent device which has satisfactory level of light-emitting efficiency, and in particular emits light of a blue color.

SUMMARY OF THE INVENTION

A first aspect of the invention is to provide an organic electroluminescent device having at least one organic compound layer containing a light-emitting layer between an anode and a cathode, wherein the organic compound layer contains a fluorescent light-emitting compound emitting a fluorescent light at a time that voltage is applied, and an amplifying agent, and a phosphorescent light-emitting maximum wavelength of the amplifying agents is 500 nm or less, and light emission at a time that voltage is applied is mainly derived from the light emission of the fluorescent compound.

In this respect, the light-emitting maximum wavelength from the fluorescent light-emitting compound is preferably 500 nm or less.

It is also preferable that the light-emitting layer contains at least one kind of host material that a $T_1$ level (an energy level at a lowest excitation triplet state) of the host material is within a range of from 60 kcal/mol to 90 kcal/mol.

In the invention, it is preferable that at least one kind of amplifying agent is a compound represented by the following formula (1).

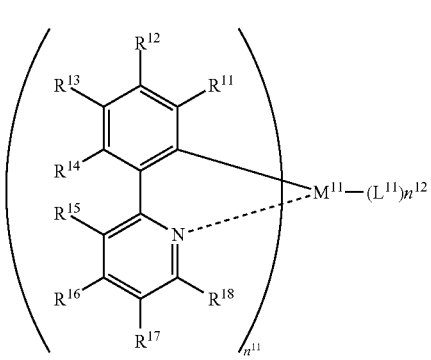

Formula (1)

wherein $R^{11}$ to $R^{18}$ each represents a hydrogen atom or a substituent. At least one of $R^{11}$ to $R^{14}$ is an electron attractive group. $L^{11}$ represents a ligand. $M^{11}$ represents a transition metal ion. $n^{11}$ is an integer of 1 to 3. $n^{12}$ is an integer of 0 to 4.

The organic electroluminescent device of the invention can achieve a high level of light-emitting efficiency, and in particular emit light of a blue color. Therefore, the organic electroluminescent device of the invention can be used to advantage in fields such as display devices, displays, backlights, electrophotography, light sources for illumination, light sources for recording, light sources for exposure, light sources for reading, signs, signboards, interior decorations and optical communications.

DETAILED DESCRIPTION OF THE EMBODIMENTS

The present invention provides an organic electroluminescent device, hereinafter also referred to as an "device" or a "light-emitting device", having at least one organic compound layer containing a light-emitting layer between a pair of electrodes (an anode and a cathode), wherein the organic compound layer contains a fluorescent light-emitting compound emitting fluorescence at a time that voltage is applied and an amplifying agent, and wherein a phosphorescent light-emitting maximum wavelength of the amplifying agents is 500 nm or less, and light emission at a time that voltage is applied, is mainly derived from the light emission of the fluorescent compound.

Herein, "amplifying agent" means a compound capable of amplifying the number of singlet excitons generated at a time that voltage is applied and then amplifying the intensity of the light emission at a time that voltage is applied. In other words, "the light emission at a time that voltage is applied is mainly derived from the light emission of a fluorescent compound"

means that light emission (fluorescence) from the singlet excitons is 51% or more of the light-emitting component obtained from the device, and that light emission (phosphorescence) from triplet excitons is 49% or less. Preferably, fluorescence is 70% or more of the light-emitting component obtained from the device, and the phosphorescence is 30% or less. More preferably, the fluorescence is 80% or more of the light-emitting component obtained from the device, and the phosphorescence is 20% or less. Still more preferably, the fluorescence is 90% or more, and the phosphorescence is 10% or less.

It is preferable that the fluorescent light emission enhances mainly the response of the light emission and durability, and in addition inhibits a reduction in effectiveness at a time that there is high degree of luminance (for instance, 1000 cd/m$^2$ or more).

It is absolutely essential that the phosphorescent light-emitting maximum wavelength of an amplifying agent be 500 nm or less, preferably within a range of from 380 nm to 490 nm, more preferably from 400 nm to 480 nm, further more preferably from 410 nm to 470 nm, and particularly preferably from 420 nm to 460 nm.

A phosphorescent light-emitting maximum wavelength of more than 500 nm causes the decrease in the efficiency of a blue light-emitting device.

Methods for measuring the phosphorescence of an amplifying agent are, for example, a process involving freeze-deaerating a solution (for instance, a toluene solution of $1 \times 10^{-5}$ mol/l) containing an amplifying agent, and photo-exciting and measuring the absorption maximum wavelength at 20° C.

The phosphorescence quantum yield of an amplifying agent is preferably 20% or more, more preferably 40% or more, and still more preferably 60% or more. The phosphorescence quantum yield of the amplifying agent can be measured at 20° C. by freeze-deaerating a solution (for instance, a toluene solution of $1 \times 10^{-5}$ mol/l) containing the amplifying agent.

The light-emitting maximum wavelength from the fluorescent light-emitting compound is preferably 500 nm or less, more preferably within a range of from 350 nm to 500 nm, and still more preferably within a range of from 400 nm to 490 nm and particularly preferably within a range of from 410 nm to 485 nm, and most preferably within a range of from 420 nm to 480 nm. With a light-emitting maximum wavelength of 500 nm or less it is possible to obtain cause blue light emissions of a high color purity.

It is preferable that the light-emitting device of the invention has a light-emitting layer containing at least one kind of host material. When the light-emitting layer is composed of a multiple layer, the host material may be contained in the layer containing the fluorescent light-emitting compound included in the light-emitting layer, or alternatively may be contained in another layer containing the amplifying agent. In terms of light-emitting efficiency, the host material is preferably contained both in the layer containing the compound emitting the fluorescence and in another layer containing the amplifying agent.

The $T_1$ level (the energy level at a lowest excitation triplet state) of the host material contained in the light-emitting device of the invention is preferably within a range of from 60 kcal/mol (251.4 kJ/mol) to 90 kcal/mol (377.1 kJ/mol), more preferably from 61 kcal/mol (255.6 kJ/mol) to 80 kcal/mol (335.2 kJ/mol), and further more preferably from 62 kcal/mol (259.8 kJ/mol) to 70 kcal/mol (293.3 kJ/mol).

With a $T_1$ level of from 60 kcal/mol to 90 kcal/mol it is possible to secure an improvement in light-emitting efficiency.

In the light-emitting device of the invention, the $T_1$ level (the energy level of a lowest excitation triplet state) of at least one layer (preferably a layer adjoining the light-emitting layer, for instance, an electron-transporting layer, a hole-blocking layer or an exciton block layer) formed between the light-emitting layer and the cathode is preferably within a range of from 60 kcal/mol (251.4 kJ/mol) to 90 kcal/mol (377.1 kJ/mol), more preferably from 61 kcal/mol (255.6 kJ/mol) to 80 kcal/mol (335.2 kJ/mol), and further more preferably from 62 kcal/mol (259.8 kJ/mol or more) to 70 kcal/mol (293.3 kJ/mol).

With a $T_1$ level of from 60 kcal/mol to 90 kcal/mol it is possible to prevent the extinction (disappearance) of the triplet excitons of the light-emitting layer, and to secure an improvement of the light-emitting efficiency.

In the light-emitting device of the invention, the $T_1$ level (the energy level of a lowest excitation triplet state) of at least one layer (preferably a layer adjoining the light-emitting layer, for instance, a hole-transporting layer or the like) formed between the light-emitting layer and the anode is preferably within a range of from 60 kcal/mol (251.4 kJ/mol) to 90 kcal/mol (377.1 kJ/mol), more preferably from 61 kcal/mol (255.6 kJ/mol) to 80 kcal/mol (335.2 kJ/mol), and further more preferably from 62 kcal/mol (259.8 kJ/mol or more) to 70 kcal/mol (293.3 kJ/mol).

With a $T_1$ level of from 60 kcal/mol to 90 kcal/mol it is possible to prevent the extinction (disappearance) of the triplet excitons of the light-emitting layer, and to secure an improvement in light-emitting efficiency.

As described above, the amplifying agent used in the invention is capable of amplifying the number of singlet excitons generated at a time that voltage is applied, and then amplifying the intensity of emission of the fluorescent light-emitting compound. As long as the amplifying agent amplifies the number of singlet excitons generated at a time that voltage is applied, the amplifying agents is not particularly limited. Examples of amplifying agents include a compound capable of making the energy of the triplet excitons generated in the light-emitting device transfer to the singlet excitons of the fluorescent light-emitting compound or to the host material. Examples of compounds which can perform these functions satisfactorily include a compound emitting phosphorescence at 20° C. (the quantum yield of the phosphorescence is preferably 50% or more, more preferably 70% or more, and more preferably 90% or more), such as a transition metal complex.

The transition metal complex is more preferably an iridium complex, a platinum complex, a rhenium complex, a ruthenium complex, a palladium complex, a rhodium complex, a copper complex or a rare earth device complex. The iridium complex and the platinum complex are more preferable.

Transition metal complexes described in Japanese Patent Applications Laid-Open (JP-A) Nos. 2002-117978, 2002-170684, 2002-173674, 2002-235076, 2002-241751, 2003-123982 and 2003-133074 are preferable. The transition metal complexes described in JP-A Nos. 2003-123982, 2003-133074 and 2002-117978 are more preferable. The transition metal complex described in JP-A No. 2003-133074 is still more preferable.

It is preferable that at least one kind of amplifying agent used in the invention is a compound represented by the following formula (1), which will now be described.

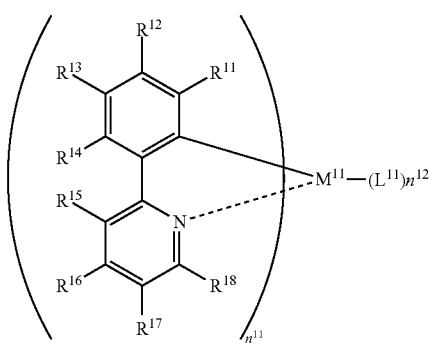

Formula (1)

In formula (1), $R^{11}$ to $R^{18}$ each represents a hydrogen atom or a substituent. Examples of substituents include an alkyl group (preferably having 1 to 30 carbon atoms, more preferably 1 to 20 carbon atoms and particularly preferably 1 to 10 carbon atoms, such as methyl, ethyl, iso-propyl, tert-butyl, n-octyl, n-desyl, n-hexadecyl, cyclopropyl, cyclopenthyl and cyclohexyl); an alkenyl group (preferably having 2 to 30 carbon atoms, more preferably 2 to 20 carbon atoms and particularly preferably 2 to 10 carbon atoms, such as vinyl, allyl, 2-butenyl and 3 -pentenyl); an alkynyl group (preferably having 2 to 30 carbon atoms, more preferably 2 to 20 carbon atoms and particularly preferably 2 to 10 carbon atoms, such as propargyl and 3-pentenyl); an aryl group (preferably having 6 to 30 carbon atoms, more preferably 6 to 20 carbon atoms and particularly preferably 6 to 12 carbon atoms, such as phenyl, p-methylphenyl, naphthyl and anthranyl); an amino group (preferably having 0 to 30 carbon atoms, more preferably 0 to 20 carbon atoms and particularly preferably 0 to 10 carbon atoms, such as amino, methylamino, dimethylamino, diethylamino, dibenzylamino, diphenylamino and ditolylamino); an alkoxy group (preferably having 1 to 30 carbon atoms, more preferably 1 to 20 carbon atoms and particularly preferably 1 to 10 carbon atoms, such as methoxy, ethoxy, butoxy and 2-ethylhexyloxy); an aryloxy group (preferably having 6 to 30 carbon atoms, more preferably 6 to 20 carbon atoms and particularly preferably 6 to 12 carbon atoms, such as phenyloxy, 1-naphthyloxy and 2 -naphthyloxy); a heterocyclic oxy group (preferably having 1 to 30 carbon atoms, more preferably 1 to 20 carbon atoms and particularly preferably 1 to 12 carbon atoms, such as pyridyloxy, pyradyloxy, pyrimidyloxy and quinolyloxy ); an acyl group (preferably having 1 to 30 carbon atoms, more preferably 1 to 20 carbon atoms and particularly preferably 1 to 12 carbon atoms, such as acetyl, benzoyl, formyl and pivaloyl); an alkoxy carbonyl group (preferably having 2 to 30 carbon atoms, more preferably 2 to 20 carbon atoms and particularly preferably 2 to 12 carbon atoms, such as methoxycarbonyl and ethoxycarbonyl); an aryloxycarbonyl group (preferably having 7 to 30 carbon atoms, more preferably 7 to 20 carbon atoms and particularly preferably 7 to 12 carbon atoms, such as phenyloxycarbonyl); an acyloxy group (preferably having 2 to 30 carbon atoms, more preferably 2 to 20 carbon atoms and particularly preferably 2 to 10 carbon atoms, such as acetoxy and benzoyloxy); an acylamino group (preferably having 2 to 30 carbon atoms, more preferably 2 to 20 carbon atoms and particularly preferably 2 to 10 carbon atoms, such as acetylamino and benzoylamino); an alkoxycarbonylamino group (preferably having 2 to 30 carbon atoms, more preferably 2 to 20 carbon atoms and particularly preferably 2 to 12 carbon atoms, such as methoxycarbonylamino); an aryloxycarbonylamino group (preferably having 7 to 30 carbon atoms, more preferably 7 to 20 carbon atoms and particularly preferably 7 to 12 carbon atoms, such as phenyloxycarbonylamino); a sulfonylamino group (preferably having 1 to 30 carbon atoms, more preferably 1 to 20 carbon atoms and particularly preferably 1 to 12 carbon atoms, such as methanesulfonylamino and benzensulfonylamino ); a sulfamoyl group (preferably having 0 to 30 carbon atoms, more preferably 0 to 20 carbon atoms and particularly preferably 0 to 12 carbon atoms, such as sulfamoyl, methylsulfamoyl, dimethylsulfamoyl and phenylsulfamoyl); a carbamoyl group (preferably having 1 to 30 carbon atoms, more preferably 1 to 20 carbon atoms and particularly preferably 1 to 12 carbon atoms, such as carbamoyl, methylcarbamoyl, diethylcarbamoyl and phenylcarbamoyl); an alkylthio group (preferably having 1 to 30 carbon atoms, more preferably 1 to 20 carbon atoms and particularly preferably 1 to 12 carbon atoms, such as methylthio and ethylthio); an arylthio group (preferably having 6 to 30 carbon atoms, more preferably 6 to 20 carbon atoms and particularly preferably 6 to 12 carbon atoms, such as phenylthio); a heterocyclic thio group (preferably having 1 to 30 carbon atoms, more preferably 1 to 20 carbon atoms and particularly preferably 1 to 12 carbon atoms, such as pyridylthio, 2-benzoimidazolylthio, 2-benzoxazolylthio, and 2 -benzothiazolylthio ); a sulfonyl group (preferably having 1 to 30 carbon atoms, more preferably 1 to 20 carbon atoms and particularly preferably 1 to 12 carbon atoms, such as mesyl and tosyl); a sulfinyl group (preferably having 1 to 30 carbon atoms, more preferably 1 to 20 carbon atoms anid particularly preferably 1 to 12 carbon atoms, such as methanesulfinyl and benzensulfinyl); a ureido group (preferably having 1 to 30 carbon atoms, more preferably 1 to 20 carbon atoms and particularly preferably 1 to 12 carbon atoms, such as ureido, methylureido and phenylureido); a phosphoric acid amido group (preferably having 1 to 30 carbon atoms, more preferably 1 to 20 carbon atoms and particularly preferably 1 to 12 carbon atoms, such as diethyl phosphoric acid amido and phenylphosphoric acid amido); a hydroxyl group; a mercapto group; a halogen atom (such as a fluorine atom, a chlorine atom, a bromine atom and an iodine atom); a cyano group; a sulfo group; a carboxyl group; a nitro group; a hydroxamic acid group; a sulfmo group; a hydrazine group; an imino group; a heterocyclic group (preferably having 1 to 30 carbon atoms and more preferably 1 to 12 carbon atoms). Examples of hetero atoms include a nitrogen atom, an oxygen atom and a sulfur atom. Specific examples of hetero atoms include imidazolyl, pyridyl, quinolyl, furyl, thienyl, piperidil, morpholino, benzoxazolyl, benzimidazolyl, benzthiazolyl, a carbazolyl group and an azepinyl group); a silyl group (preferably having 3 to 40 carbon atoms, more preferably 3 to 30 carbon atoms and particularly preferably 3 to 24 carbon atoms, such as trimethylsilyl and triphenylsilyl); and a silyloxy group (preferably having 3 to 40 carbon atoms, more preferably 3 to 30 carbon atoms and particularly preferably 3 to 24 carbon atoms, such as trimethylsilyloxy and triphenylsilyloxy. These substituents may be further substituted. $R^{11}$ to $R^{18}$ may be combined with each other to form a ring structure (for instance, a benzo-condensed ring or a heterocyclic condensed ring).

In formula (1), at least one of $R^{11}$ to $R^{14}$ is an electron attractive group (for instance, a cyano group, a trifluoro methyl group, an acyl group, a sulfonyl group or a halogen atom or the like), preferably a trifluoro methyl group or a fluorine atom, and more preferably a fluorine atom.

At least another one of $R^{11}$ to $R^{14}$ is preferably a hydrogen atom, an alkyl group, a halogen atom (a fluorine atom, a chlorine atom, a bromine atom and an iodine atom), an aryl group or a heterocyclic group, more preferably a hydrogen atom, an alkyl group or a fluorine atom, and more preferably a hydrogen atom or a fluorine atom.

In the compound represented by formula (1), at least one of $R^{12}$ and $R^{14}$ is preferably a fluorine atom, and more preferably $R^{12}$ and $R^{14}$ are both fluorine atoms. It is preferable that at least one of $R^{12}$ and $R^{14}$ is a fluorine atom and that $R^{13}$ is a substituent. It is more preferable that both $R^{12}$ and $R^{14}$ are fluorine atoms and that $R^{13}$ is an electron attractive group. It is still more preferable that $R^{12}$ and $R^{14}$ are both fluorine atoms and that $R^{13}$ is a cyano group.

Also, in the compound represented by formula (1), it is preferable that at least one of $R^{12}$ and $R^{14}$ is a fluorine atom and that $R^{16}$ is a substituent. It is more preferable that at least one of $R^{12}$ and $R^{14}$ is a fluorine atom and that $R^{16}$ is an electron donating group. The electron donating group is preferably an alkoxy group or an N,N-disubstituted amino group, and most preferably an alkoxy group.

$M^{11}$ represents a transition metal ion in formula (1). Though the transition metal ion is not particularly limited, an iridium ion, a platinum ion, a rhenium ion and a ruthenium ion are preferable, more preferably an iridium icon and a platinum ion, and particularly preferably an iridium ion.

$L^{11}$ represents a ligand. The ligand includes those described in H. Yersin, Photochemistry and Photophysics of Coordination Compounds, Springer-Verlag, 1987 and in Yamamoto Akio, Yukikinzokukagaku-Kiso to Oyo-, Shokabo Publishing Co., 1982. Preferable are halogen ligands (preferably, chlorine and fluorine), nitrogen-containing heterocyclic ligands (for instance, bipyridyl, phenanthroline, phenylpyridine, pyrazolylpyridine and benzimidazolylpyridine), diketone ligands (for instance acetylacetone derivatives), nitrile ligands, CO ligands, isonitrile ligands (for instance, methylisonitrile derivatives), phosphorus ligands (for instance, unidentate or multidentate phosphorus ligands (preferably bidentate, for example, 1,2-diphenylphosphinobenzene derivatives), for example, a phosphine derivative, a photosphorous ester derivative or a phosphinin derivative naphthyl), carboxylic acid ligands (for instance, an acetic acid derivative, and a picolinic acid derivative), and more preferably bidentate nitrogen-containing heterocyclic ligands.

Examples of bidentate nitrogen-containing heterocyclic ligands include a ligand having pyridine, pyrazine, pyrimidine, pyridazine, pyrrole, pyrazole, imidazole, triazole, oxazole, thiazole, oxadiazole or thiadiazole (for instance, a picoline ligand, a pyrazolylpyridine ligand or a benzimidazolylpyridine ligand). A ligand having pyridine, pyrrole, pyrazole, imidazole or triazole is preferable, more preferably a ligand having pyridine, pyrazole or imidazole, and still more preferably a ligand having pyridine or pyrazole. $n^{11}$ is within a range of from 0 to 3 in formula (1), and more preferably 2 or 3. $n^{12}$ represents an integer of 0 to 4, preferably 0 to 2, and more preferably 0 or 1. A combination of $n^{11}$ and $n^{12}$ is preferably a combination in which a compound represented by formula (1) is a neutral complex.

The fluorescent light-emitting compound used in the invention is preferably a fused aromatic compound. Examples of fused aromatic compounds include a compound having a fused aromatic hydrocarbon ring (for instance, naphthalene, anthracene, phenanthrene, acenaphthylene, pyrene, perylene, fluoranthene, tetracene, chrysene, pentasene, coronene and derivatives of these compounds (such as tetra-t-butylpyrene, binaphthyl, rubrene, benzopyrene or benzoanthracene), a compound having a fused aromatic hetero ring (such as quinoline, quinoxaline, benzoimidazole, benzoxazole, imidazopyridine, azaindole and derivatives of these compounds (for instance, bisbenzooxazolylbenzen and benzoquinoline)). The compound having the fused aromatic hydrocarbon ring is preferable.

Preferable examples of a compound having a fused aromatic hydrocarbon ring are naphthalene, anthracene, phenanthrene, acenaphthylene, pyrene, perylene, fluoranthene and derivatives of these compounds, and more preferably anthracene, fluoranthene, pyrene, perylene and derivatives of these compounds, further more preferably anthracene derivatives, fluoranthene derivatives, pyrene derivatives and perylene derivatives, and particularly preferably perylene derivatives.

In the light-emitting device of the invention, the organic compound layer preferably has an electron-transporting layer containing a non-complex compound. It is more preferable that the electron-transporting layer be composed of the non-complex compound. Though the non-complex compound is not particularly limited, it is preferably a nitrogen-containing heterocyclic compound.

The nitrogen-containing heterocyclic compound is preferably, but not limited to, a 6-membered ring aromatic nitrogen-containing heterocyclic compound or a 5-membered ring aromatic nitrogen-contairning heterocyclic compound is preferable. Pyridine, pyrazine, pyrimidine, triazine, quinoxaline, quinoline, pyrrole, pyrazole, imidazole, oxazole, thiazole, oxadiazole, thiadiazole and derivatives of these compounds (for instance, tetraphenylpyridine, benzoimidazole and imidazopyridine) are more preferred. The imidazole derivative is more preferred, and the imidazopyridine derivative is particularly preferred.

The nitrogen-containing heterocyclic compound is preferably a compound represented by the following formulae (2) or (3), more preferably the compound represented by the following formula (2).

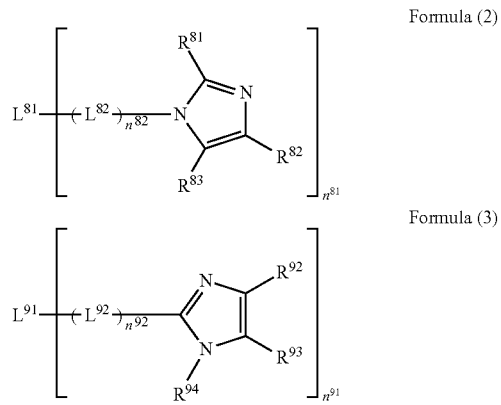

Formula (2)

Formula (3)

Hereinafter, formula (2) will be described. $R^{81}$, $R^{82}$ and $R^{83}$ each represents a hydrogen atom or a substituent in formula (2). Examples of substituents include the groups represented by $R^{11}$ to $R^{18}$ and $R^{11}$ to $R^{14}$ in formula (1).

$R^{81}$ preferably represents an alkyl group, an aryl group or a heteroaryl group, more preferably an alkyl group or an aryl group and particularly preferably an alkyl group.

$R^{82}$ and $R^{83}$ each represents an alkyl group, an aryl group, an heteroaryl group or a group which combines substituents with each other to form an aromatic ring. A group which combines substituents with each other to form an aromatic ring is more preferred.

$L^{81}$ represents a linking group in formula (2). $L^{81}$ is preferably an aryl linking group, a heteroaryl linking group or an alkyl linking group, more preferably an aryl linking group or a heteroaryl linking group and particularly preferably a nitrogen-containing heteroaryl linking group.

n81 represents an integer of 2 or more in formula (2). n81 is preferably 2 to 6, and more preferably 3 or 4.

$L^{82}$ represents a divalent linking group in formula (2). $L^{82}$ preferably represents an alkylene group, an arylene group, a heteroarylene group, an oxygen linking group, a carbonyl linking group or an amino linking group, more preferably an alkylene group or an arylene group.

$n^{82}$ represents an integer of 0 to 6 in formula (2), preferably 0 to 3, and more preferably 0 or 1. When $n^{82}$ is 2 or more, a plurality of $L^{82}$ may be the same or different.

Hereinafter, formula (3) will be described. $R^{92}$ and $R^{93}$ each represents a hydrogen atom or a substituent in formula (3). Examples of substituents include the groups represented by $R^{11}$.

$R^{92}$ and $R^{93}$ each preferably represents an alkyl group, an aryl group, a heteroaryl group or a group which combines substituents with each other to form an aromatic ring. A group which combines substituents with each other to form an aromatic ring is more preferred. A group which combines substituents with each other to form a nitrogen-containing aromatic ring is particularly preferred.

$R^{94}$ represents a hydrogen atom or a substituent in formula (3). Examples of substituents include the groups represented by the substituent of the substituted nitrogen atom. $R^{94}$ preferably represents an alkyl group, an aryl group, or a heteroaryl group, more preferably an aryl group or a heteroaryl group, and particularly preferably an al group.

In formula (3), $L^{91}$, $L^{92}$, $n^{91}$ and $n^{92}$ each has the same meaning as $L^{81}$, $L^{82}$, $n^{81}$ and $n^{82}$ respectively. Preferred ranges of $L^{91}$, $L^{92}$, $n^{91}$ and $n^{92}$ are also the same as for $L^{81}$, $L^{82}$, $n^{81}$ and $n^{82}$ respectively.

The external quantum efficiency of the light-emitting device of the invention is preferably 5% or more, more preferably 10% or more and still more preferably 13% or more. The maximum value of the external quantum efficiency at a time that the device is driven at 20° C., and the value of the external quantum efficiency in the vicinity of 100 to 300 cd/m² at a time that the device is driven at 20° C., can each be used as the numerical value of the external quantum efficiency.

The internal quantum efficiency of the light-emitting device of the invention is preferably 30% or more, more preferably 50% or more, and still more preferably 70% or more. The internal quantum efficiency of the device is calculated by "internal quantum efficiency=external quantum efficiency/light take-out efficiency". A typical organic EL device has a light extraction efficiency of about 20%, but the light extraction efficiency can be adjusted to 20% or more by finessing factors such as the shape of a substrate, the shape of an electrode, the film thickness of an organic layer, the film thickness of an inorganic layer, the refractive index of the organic layer, and the refractive index of the organic layer.

The concentration of amplifying agent in the organic compound layer is preferably, but not particularly limited to, within a range of from 0.1% by mass to 9% by mass, and more preferably from 1% by mass to 8% by mass, still more preferably within a range of from 2% to 7%, and particularly preferably from 3% to 6%. From the point of view of improving efficiency and durability of the device, it is preferable that the concentration be within these values.

The compound emitting fluorescence used in the invention (fluorescent light-emitting compound) is preferably, but not limited to, a compound in which a light-emitting maximum wavelength from the fluorescent light-emitting compound is within a range of from 350 nm to 565 nm, more preferably within a range of from 400 nm to 500 nm, and particularly preferably within a range of from 400 nm to 470 nm. The value measured in a solid film at 20° C. can be used as the maximum wavelength of the light emission.

The fluorescent quantum yield of the fluorescent light-emitting compound is preferably 70% or more, and more preferably 80% or more, still more preferably 90% or more, and particularly preferably 95% or more. The value when measured at 20° C. in a state in which the organic compound layer is formed, or in a state in which the fluorescent light-emitting compound is dissolved or dispersed in the solution, can be used as the fluorescent quantum yield.

The light-emitting device of the invention, may have on the anode as the organic compound layer at least a hole-transporting layer, a light-emitting layer and an electron-transporting layer in that order, and the cathode on the electron-transporting layer. It is preferable that the light-emitting layer contains at least one kind of compound emitting fluorescence (fluorescent light-emitting compound) at a time that voltage is applied, and that, relative to the total light emission obtained from the device, the light emission from the fluorescent light-emitting compound contained in the light-emitting layer is preferably 80% or more, more preferably 85% or more, and particularly preferably 90% or more. Examples of light emission obtained from the device include light emission from not only the fluorescent light-emitting compound contained in the light-emitting layer, but also from sources such as an amplifying agent, a host material, an electron-transporting layer, or a hole-transporting layer.

It is preferable to keep light emission from the amplifying agent at a low rate and thus enhance the response of the light emission. Further, a reduction in light emission from the host material, the electron-transporting layer or the hole-transporting layer is equivalent to a reduction in light emission which is not amplified, and this is preferable from the point of view of enhancing the efficiency of the device.

In the device of the invention, the difference between the maximum light-emitting wavelength of the compound emitting fluorescence (fluorescent light-emitting compound) at a time that voltage is applied and the maximum light-emitting wavelength of the amplifying agent is preferably within a range of from −20 nm to 70 nm, more preferably from −10 nm to 65 nm, and still more preferably from −5 nm to 60 nm. A value pertaining at a time when the device is made to emit light at 20° C. can be used as the maximum light-emitting wavelength of the fluorescent light-emitting compound at a time that voltage is applied. The value of light emission derived from the amplifying agent, or the value of a photo luminescence of a solid film obtained by mixing the amplifying agent with a host material, can be used as the light-emitting maximum wavelength of the amplifying agent.

In the device of the invention, the difference between the light-emitting maximum wavelength of the amplifying agent and the absorption maximum wavelength of the fluorescent light-emitting compound is preferably within a range of from −100 nm to 60 nm, more preferably from −80 nm to 30 nm, still more preferably from −60 nm to 20 nm, and particularly preferably from −50 nm to 10 nm. A value in a solid film at 20° C. or a value in a solution (a solvent such as toluene or chloroform, with a concentration: $1\times10^{-5}$ mol/L or the like) can be used as the absorption maximum wavelength of the fluorescent light-emitting compound.

The device of the invention which has at least three layers of a hole-transporting layer, a light-emitting layer and an electron-transporting layer preferably has neither a hole-blocking layer nor an exciton block layer between the light-emitting layer and the electron-transporting layer. It is also preferable that only one electron-transporting layer be disposed between the light-emitting layer and the cathode.

The hole-blocking layer is capable of blocking holes injected from the anode. The exciton block layer is capable of blocking excitons generated in the light-emitting layer and thus limiting the light-emitting area, BCP is an appropriate material for these layers.

An ionization potential of the host material contained in the light-emitting layer of the device of the invention is preferably within a range of from 5.8 eV to 6.3 eV, more preferably within a range of from 5.95 eV to 6.25 eV, and still more preferably within a range of from 6.0 eV to 6.2 eV.

The degree of electron mobility of the host material in the light-emitting device of the invention is preferably within a range of from $1\times10^{-6}$ Vs/cm to $1\times10^{-1}$ Vs/cm, more preferably within a range of from $5\times10^{-6}$ Vs/cm to $1\times10^{-2}$ Vs/cm, still more preferably within a range of from $1\times10^{-5}$ Vs/cm to $1\times10^{-2}$ Vs/cm, and particularly preferably within a range of from $5\times10^{-5}$ Vs/cm to $1\times10^{-2}$ Vs/cm.

The degree of hole mobility of the host material in the light-emitting device of the invention is preferably within a range of from $1\times10^{-6}$ Vs/cm to $1\times10^{-1}$ Vs/cm, more preferably within a range of from $5\times10^{-6}$ Vs/cm to $1\times10^{-2}$ Vs/cm, more preferably within a range of from $1\times10^{-5}$ Vs/cm to $1\times10^{-2}$ Vs/cm, and particularly preferably within a range of from $5\times10^{-5}$ Vs/cm to $1\times10^{-2}$ Vs/cm.

In the host material contained in the light-emitting layer of the invention, the fluorescence wavelength of the host material in the state that the organic compound layer (film state) is formed is preferably within a range of from 350 nm to 500 nm, more preferably within a range of from 360 nm to 490 nm, still more preferably from 370 nm to 480 nm.

The light-emitting device of the invention preferably emits light at the central part of the light-emitting layer. If the compound which quenches the triplet excitons exist in layers (the hole-transporting layer, the exciton blocking layer (or the hole blocking layer) which are adjacent to the light emitting layer and the electron-transporting layer), a decrease in external quantum efficiency is smaller (for instance, within 20%) than in a case in which the material which quenches the triplet excitons does not exist. In contrast, the position of the light emission can be estimated on the basis at a decrease in external quantum efficiency.

The glass transition points of the host material, the electron-transporting material and the hole-transporting material contained in the light-emitting layer of the invention are preferably within a range of from 90° C. to 400° C., more preferably within a range of from 100° C. to 380° C., still more preferably within a range of from 120° C. to 370° C., and particularly preferably within a range of from 140° C. to 360° C.

It is preferable that the light-emitting device of the invention has, as the organic compound layer, at least a hole-transporting layer, a light-emitting layer and an electron-transporting layer, and that the light-emitting layer has at least one kind of alternately laminated structure (alternately laminated layer) made up of a layer containing at least one kind of fluorescent light-emitting compound, and a layer having at least one kind of amplifying agent. The light-emitting layer preferably has the alternately laminated structures of 4 or more, more preferably 12 or more and still more preferably 16 or more.

In the light-emitting device having alternately laminated film of the invention, it is preferable to fabricate the alternately laminated film by means of a process containing the following steps (a) to (c):

(a) depositing a compound emitting fluorescence, or a mixture of such compounds, wherein an amplifying agent, or a mixture thereof, is blocked by a shutter positioned in the vicinity of the source of deposition, and the amplifying agent, or a mixture of such agents, is thereby prevented from being deposited on the device which is being fabricated.

(b) depositing an amplifying agent, or a compound thereof, wherein the compound emitting fluorescence, or a mixture of such compounds, is blocked by a shutter positioned in the vicinity of the source of deposition, and the compound emitting fluorescence, or a mixture of such compounds, is prevented from being deposited on the device which is being fabricated.

(c) Repeating Steps (a) and (b).

Each step is initiated by means of a switch opening or shutting the shutter positioned in the vicinity of the source of deposition. For instance, the process later described in Example 1 is an example of this.

In the light-emitting device having the alternately laminated film related to the invention, it is preferable to fabricate the alternately laminated film by means of a process containing the following steps (a) to (c):

(a) depositing the amplifying agent, or a compound thereof, wherein the compound emitting fluorescence, or a mixture of such compounds, is blocked by the shutter positioned in the vicinity of the source of deposition, and the compound emitting fluorescence, or a mixture of such compounds, is prevented from being deposited on the device which is being fabricated.

(b) depositing the compound emitting fluorescence, or a mixture of such compounds, wherein the amplifying agent, or a mixture thereof, is blocked by the shutter positioned in the vicinity of the source of deposition, and the amplifying agent, or a mixture thereof, is prevented from being deposited on the device which is being fabricated.

(c) Repeating Steps (a) and (b).

Each step is initiated by a switch opening or shutting the shutter positioned in the vicinity of the source of deposition.

The compound (the amplifying agent, the host material, the electron-transporting material and the hole-transporting material) contained in the organic compound layer of the invention may be either a low-molecular compound or a polymeric compound, including an oligomer compound, having a weight average molecular weight (polystyrene conversion) of preferably within a range of from 1,000 to 5,000,000, more preferably from 2,000 to 1,000,000, still more preferably from 3,000 to 100,000). The compound in the invention is preferably a low-molecular compound.

Next, examples of compounds (an amplifying agent, a host material, an electron-injecting/transporting material, and a hole-injecting/transporting material) contained in the organic compound layer of the invention are described below, but the invention is not limited thereto.

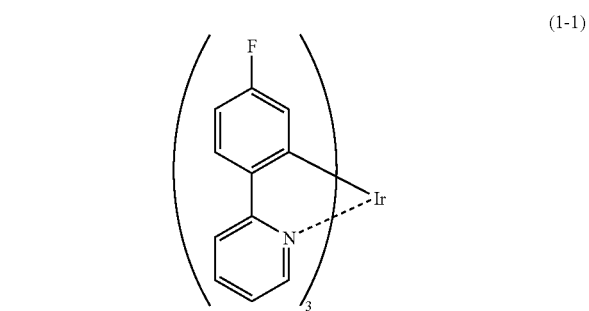

(1-1)

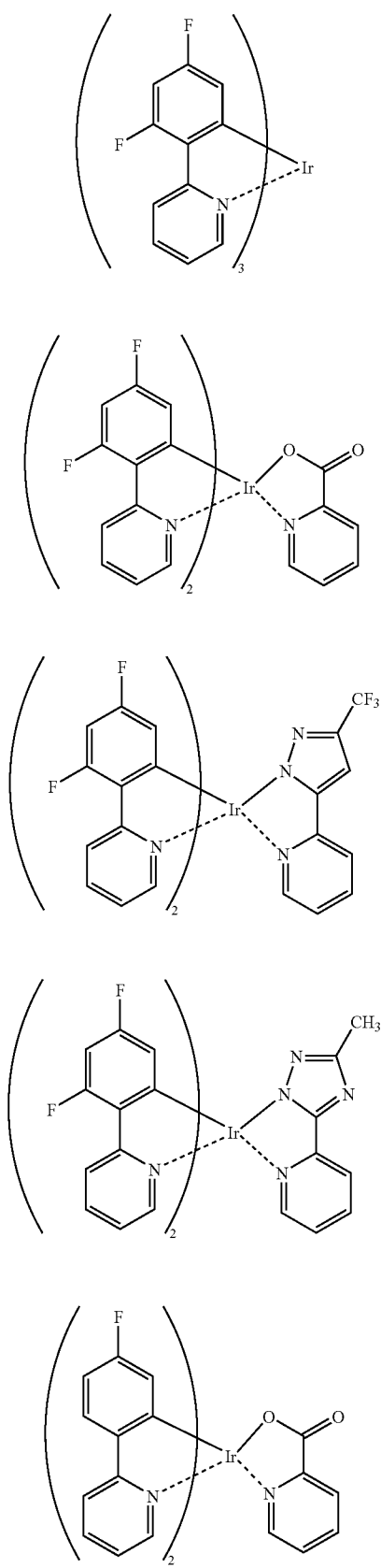
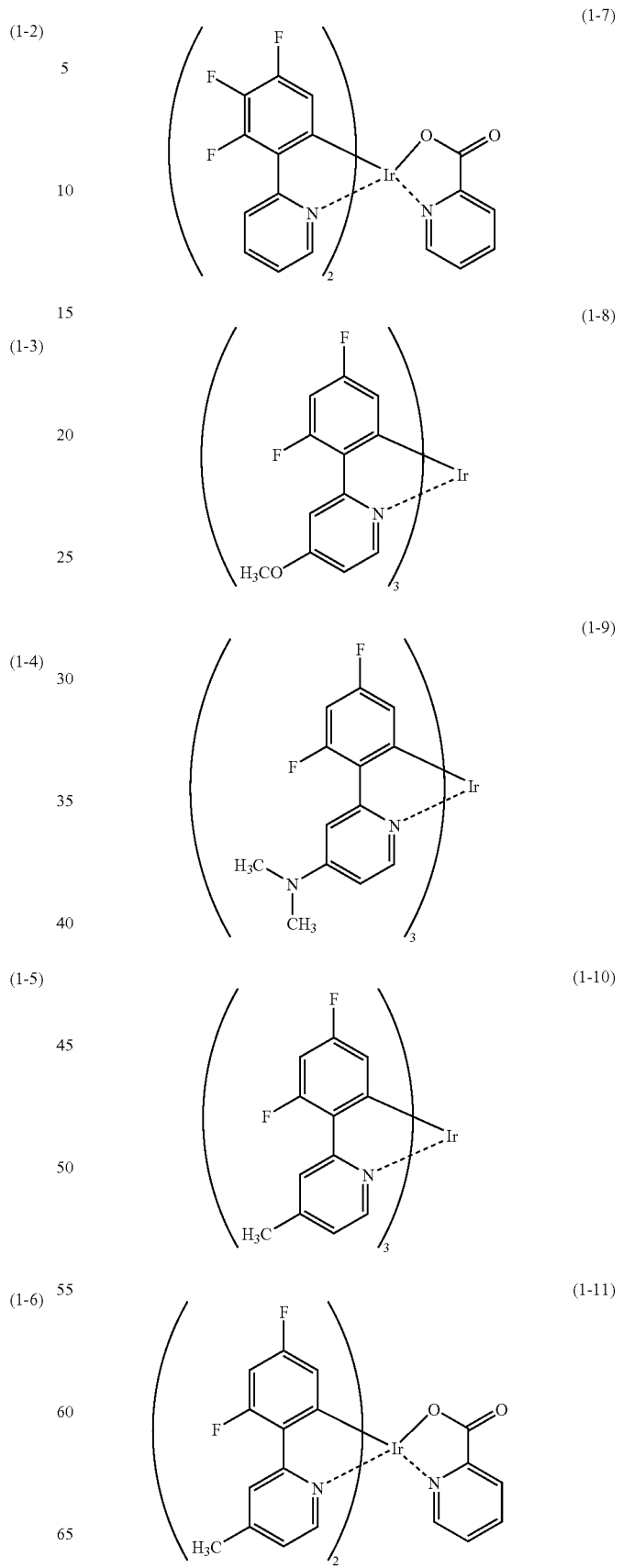

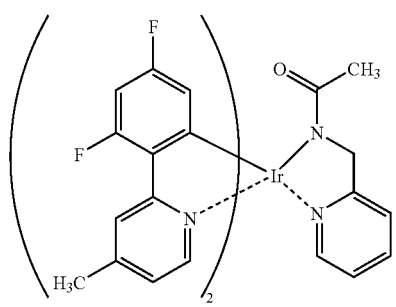
(1-12)
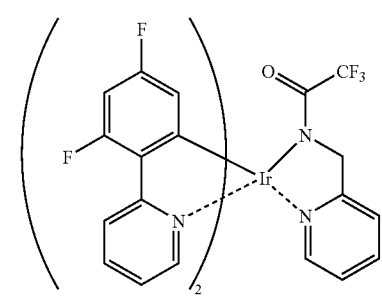
(1-13)
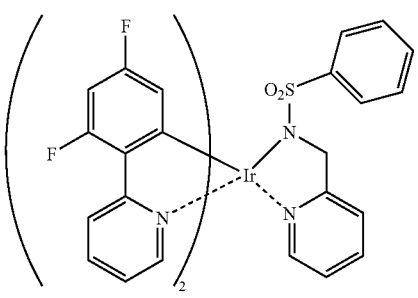
(1-14)
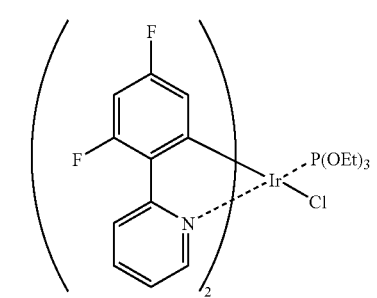
(1-15)
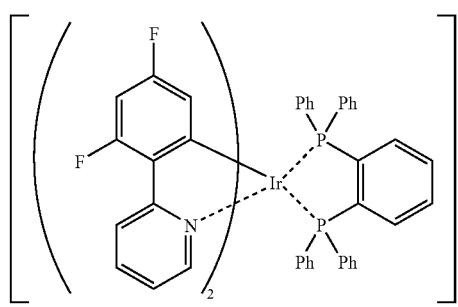
(1-16)
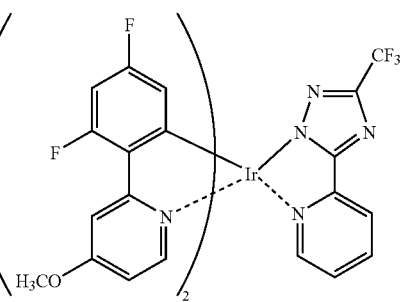
(1-17)
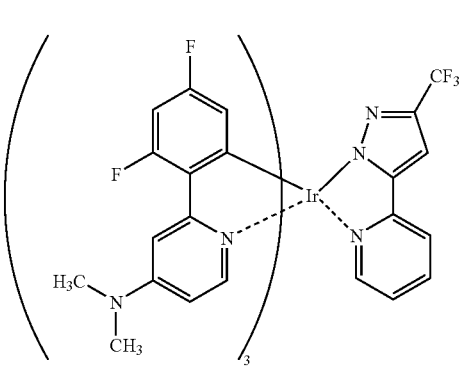
(1-18)
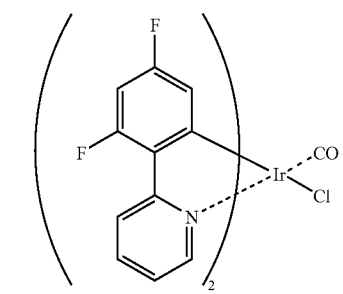
(1-19)
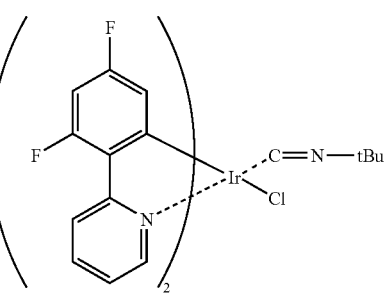
(1-20)
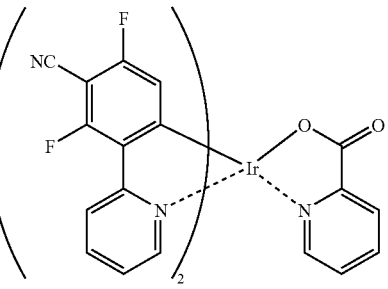
(1-21)

(1-22) 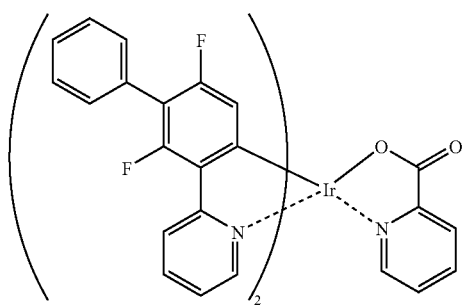
(1-27) 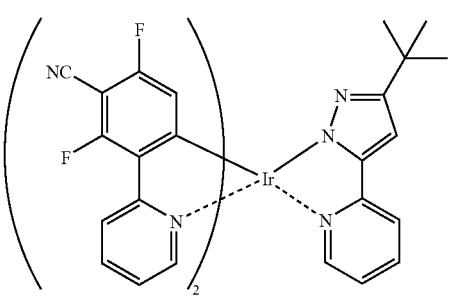
(1-23) 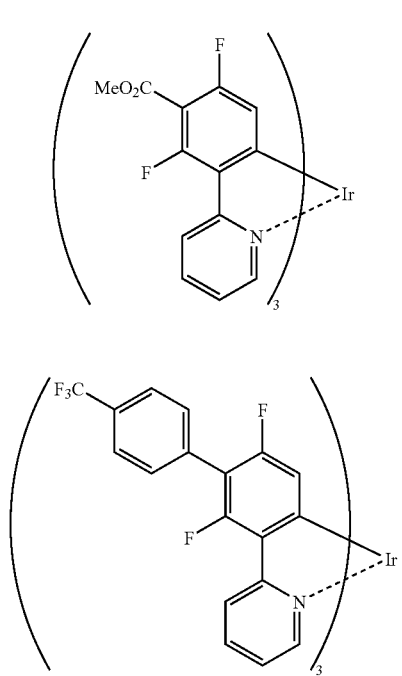
(1-28) 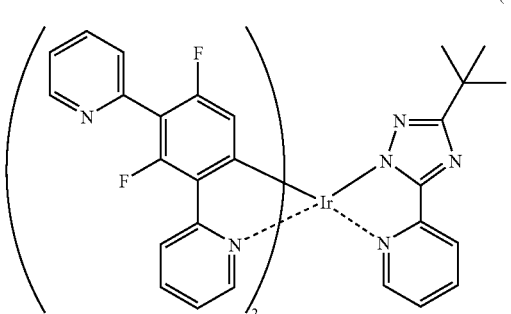
(1-24)
(1-29) 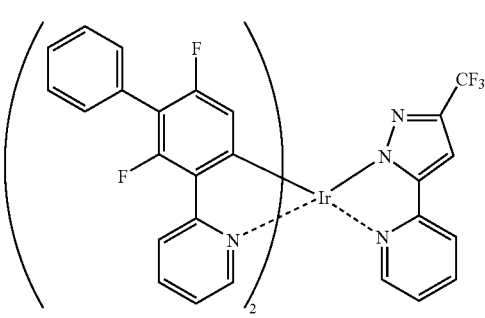
(1-25)
(1-30)
(1-26)
(1-31) 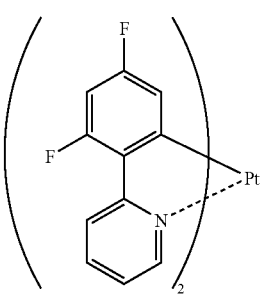

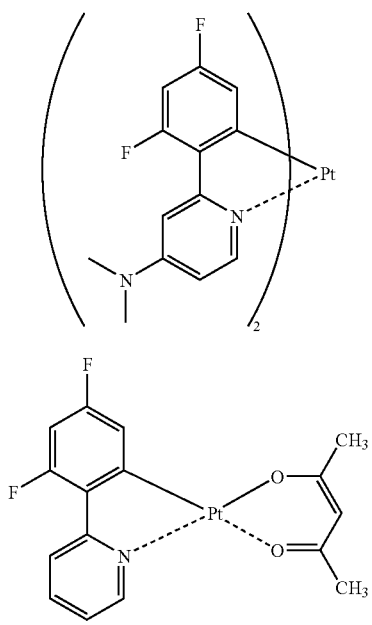

(1-32)

(1-33)

Next, the light-emitting device which contains the compound contained in the organic compound layer of the invention will be described. The light-emitting device of the invention is not limited by configuration, driving mode, use, and so forth. The organic EL (electroluminescence) device is a typical one.

The light extraction efficiency of the light emitting device of the present invention can be enhanced by various well-known methods. The light extraction efficiency and, in turn, the external quantum efficiency can for example be enhanced by fabricating the shape of the surface of substrate (for example by forming a pattern of minute concavities and convexities), or by controlling the refractive index and film thickness of a substrate, an ITO layer or an organic layer.

The light emitting device of the invention may be of the so-called top emission type wherein luminescence is taken out from an anode side, as is described in publications such as Japanese Patent Applications Laid-Open (JP-A) Nos. 2003-208109, 2003-248441, 2003-257651 and 2003-282261.

Base materials that can be used in the light emitting device of the invention include, but are not particularly limited to, inorganic materials such as zirconia stabilized yttrium and glasses; and high-molecular weight materials such as polyesters like polyethylene terephthalate, polybutyrene terephthalate and polyethylene naphthalate, polyethylene, polycarbonate, polyethersulfone, polyarylate, allyl diglycol carbonate, polyimide, polycycloolefin, norbornene resins, poly (chlorotrifluoroethylene), teflon and polytetrafluoroethylene-polyethylene copolymers.

The organic electroluminescent device of the invention may be used at the same time as other light emitting devices to produce a multicolor light emitting device or a full-color light emitting device.

A light-emitting layer of the organic electroluminescent device of the invention may have at least one laminated structure.

The film thickness of each layer constituting the lamination layer is preferably, but not particularly limited to, within a range of from 0.2 nm to 20 nm, more preferably from 0.4 nm to 15 nm, still more preferably from 0.5 nm to 10 nm, and particularly preferably from 1 nm to 5 nm.

The light-emitting layer of the organic electroluminescent device of the invention may have plural domain structures, and the other domain structures may be contained in the light-emitting layer. For instance, the light-emitting layer may be made up of an area of about 1 $nm^3$ containing a mixture of a host material A and a fluorescent material B, and another area of about 1 $nm^3$ containing a mixture of a host material C and a fluorescent material D. The diameter of each domain is preferably within a range of from 0.2 nm to 10 nm, more preferably from 0.3 nm to 5 nm, still more preferably from 0.5 nm to 3 nm, and particularly preferably from 0.7 nm to 2 nm.

Methods for forming an organic layer in the light-emitting device of the invention include, but are not limited to, vacuum deposition by resistance heating, electron beam, sputtering, molecular accumulation, coating (such as spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating and screen coating), an ink jet method, printing, and transfer. From the standpoint of film characteristics and production, resistance heating vacuum deposition, coating, and transfer are preferred.

The light emitting device of the invention is a device having a light-emitting layer, or plural organic compound films containing the light-emitting layer, positioned between a pair of electrodes, an anode and a cathode. In addition to the light-emitting layer, the light emitting device may have additional layers, such as a hole injection layer, a hole-transporting layer, an electron-injecting layer, an electron-transporting layer, and a protective layer. Each of these layers may also perform functions other than the ones implied by the designation of the layer. These layers can also be formed of various materials.

The anode supplies positive holes to organic compound layers, such as a hole-injecting layer, a hole-transporting layer, and a light-emitting layer. Materials making up the anode include metals, alloys, metal oxides, electrically conductive compounds, and mixtures thereof. Materials having a work function of 4 eV or higher are preferred. Examples of useful materials are electrically conductive metal oxides, such as tin oxide, zinc oxide, indium oxide, and indium tin oxide (ITO); metals, such as gold, silver, chromium, and nickel; mixtures or laminates of these metals and electrically conductive metal oxides; inorganic electrically conductive substances, such as copper iodide and copper sulfide; organic electrically conductive substances, such as polyaniline, polythiophene, and polypyrrole; and laminates of these materials and ITO. Conductive metal oxides are preferred, and ITO is especially preferred for its productivity, electrical conductivity, and transparency. The thickness of the anode is appropriately determined, depending on the material, but usually preferably ranges from 10 nm to 5 μm, more preferably from 50 nm to 1 μm, and still more preferably from 100 to 500 nm.

The anode is usually used as formed on a substrate, such as a soda lime glass plate, an alkali-free glass plate or a transparent resin plate. When a glass substrate is chosen, alkali-free glass is preferred, from the point of view of avoiding leaching of ions from glass. When soda lime glass is used, it is preferable that such a glass has a barrier coat of silica or the like. The thickness of the substrate is not particularly limited as long as the device can preserve mechanical strength. However, a glass substrate, for example, usually has a thickness of 0.2 mm or greater, and preferably 0.7 mm or greater.

The anode is formed by technique appropriate to the type of material. For instance, an ITO layer is formed by electron beam deposition, sputtering, resistance heating vacuum deposition, a chemical reaction (for instance, a sol-gel process), or the application of an ITO dispersion or the like.

The anode thus formed may be subjected to cleaning or a like treatment for reducing the driving voltage, or for enhancing luminescence efficiency. For an ITO anode, for instance, an UV-ozone treatment or a plasma treatment is effective.

The cathode supplies electrons to the organic layers such as an electron-injecting layer, an electron-transporting layer, and a light-emitting layer. The material making up the cathode is selected taking into consideration factors such as adhesion to an adjacent layer, such as an electron-injecting layer, an electron-transporting layer or a light-emitting layer, ionization potential and stability.

Useful materials for the cathode include metals, alloys, metal halides, metal oxides, electrically conductive compounds, and mixtures thereof. Examples of useful materials are alkali metals (for instance, Li, Na, and K) and fluorides or oxides thereof, alkaline earth metals (for instance, Mg and Ca) and fluorides or oxides thereof, gold, silver, lead, aluminum, sodium-potassium alloys or mixtures thereof, lithium-aluminum alloys or mixtures thereof, magnesium-silver alloys or mixtures thereof, and rare earth metals (for instance, indium and ytterbium). Preferable materials thereof are those having a work function of 4 eV or less, more preferably aluminum, lithium-aluminum alloys or mixtures thereof, and magnesium-silver alloys or mixtures thereof.

The cathode may have not only a single layer structure composed of materials described above, but also a laminate structure containing materials described above. For example, an aluminum/lithium fluoride laminate structure or an aluminum/lithium oxide laminate structure is preferred. The thickness of the cathode is appropriately selected depending on the material, but usually preferably ranges from 10 nm to 5 μm, more preferably from 50 nm to 1 μm, and still more preferably from 100 nm to 1 μm.

The cathode can be formed by methods such as electron beam deposition, sputtering, resistance heating vacuum deposition, coating and transfer. In vacuum deposition, a single metal may be deposited, or two or more components may be deposited simultaneously. Furthermore, plural metals may be deposited simultaneously to form an alloy cathode, or alternatively a previously formulated alloy may be deposited. The anode and the cathode each preferably has as low a sheet resistance as possible, specifically a sheet resistance of several hundreds of ohms per square or less.

Any materials can be used to make the light-emitting layer, as long as, at a time when an electrical field is applied, the resulting layer can receive positive holes from the anode, from a hole-injecting layer or from a hole-transporting layer; and can receive electrons from the cathode, from an electron-injecting layer or from an electron-transporting layer, and as long as the resulting layer can provide a site where the holes and electrons can be transported and recombined to cause light emission. Examples of useful materials for making the light-emitting layer include benzoxazole, benzimidazole, benzothiazole, styrylbenzene, polyphenyl, diphenylbutadiene, tetraphenylbutadiene, naphthylimide, coumarin, perylene, perinone, oxadiazole, aldazine, pyrralidine, cyclopentadiene, bisstyrylanthracene, quinacridone, pyrrolopyridine, thiadiazolopyridine, cyclopentadiene, styrylamine and aromatic dimethylidyne compounds; various metal complexes exemplified by metal complexes or rare earth device complexes of 8-quinolinol; polymer compounds, such as polythiophene, polyphenylene, and polyphenylene vinylene; organic silanes; transition metal complexes exemplified by an iridium-trisphenylpyridine complex and a platinum-porphyrin complex; and derivatives of these compounds.

The thickness of the light-emitting layer is not particularly limited but is usually within a range of from 1 nm to 5 μm, preferably from 5 nm to 1 μm, and more preferably from 10 nm to 500 nm.

Methods of forming the light-emitting layer include, but are not limited to, resistance heating vacuum deposition, electron beam deposition, sputtering, molecular accumulation, coating, an ink jet method, printing, LB method, and transfer. Resistance heating vacuum deposition and coating methods are preferred.

The light-emitting layer can be made of a single compound or plural compounds. The light-emitting layer can also have one or more light-emitting layers. Two or more light-emitting layers may emit light of different colors, such as white or blue. A single light-emitting layer can be designed to emit, such as blue light or white light. Each of two or more light-emitting layers may be made of a single material, or a mixture of two or more materials.

Any materials can be used to form the hole-injecting layer and the hole-transporting layer, as long as the resulting layer performs at least one of a function of injecting holes supplied by the anode, a function of transporting holes, and a function of blocking the electrons injected from the cathode. Examples of such materials include carbazole, triazole, oxazole, oxadiazole, imidazole, polyarylalkanes, pyrazoline, pyrazolone, phenylenediamine, arylamines, amino-substituted chalcones, stytylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), and aniline copolymers; conductive polymer oligomers, such as thiophene oligomers and polythiophene; organic silanes, carbon membrane; and derivatives of these compounds.

The thicknesses of the hole-injecting layer and the hole-transporting layer are not particularly limited, but are usually within a range of from 1 nm to 5 μm, preferably from 5 nm to 1 μm and more preferably from 10 nm to 500 nm. The hole-injecting layer and the hole-transporting layer may each have a single layer structure made of one or more of the materials mentioned above or a multilayer structure containing two or more layers having the same or different compositions.

The hole-injecting layer and the hole-transporting layer are each formed by, for example, vacuum deposition, LB method, wet coating with a solution or dispersion of a hole-injecting or transporting material in a solvent, an ink jet method, printing, or transfer. When wet coating techniques are adopted, it is possible to apply a resin component as a solute or dispersoid together with the resin components. Applicable resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

Any materials can be used to make up the electron-injecting layer and the electron-transporting layer, as long as the resulting layer performs at least one of a function of injecting electrons from the cathode, a function of transporting the electrons, and a function of blocking positive holes from the anode. Specific examples of such materials include triazole, oxazole, oxadiazole, imidazole, fluorenone, anthraquinodimethane, anthrone, diphenylquinone, thiopyran dioxide, carbodiimide, fluorenylidenemethane, distyrylpyrazine, aromatic (for instance, naphthalene or perylene) tetracarboxylic acid anhydrides, phthalocyanine, various metal complexes, such as metal complexes of 8-quinoliol, metallo-phthalocyanines, and metal complexes having benzoxazole or benzothiazole as a ligand; organic silanes; and derivatives of these compounds. Moreover, the compound used in the following Examples is preferable.

The thicknesses of the electron-injecting layer and the electron-transporting layer are not particularly limited but usually preferably range from 1 nm to 5 µm, more preferably from 5 nm to 1 µm and still more preferably from 10 nm to 500 nm. The electron-injecting layer and the electron-transporting layer may each have a single layer structure made of one or more of the above-described materials, or a multilayer structure containing two or more layers having the same or different compositions.

The electron-injecting layer and the electron-transporting layer are each formed by, for example, vacuum deposition, LB method, wet coating with a solution or dispersion of an electron-injecting or electron-transporting material in a solvent, an ink jet method, printing, or transfer. When wet coating techniques are adopted, it is possible to apply a resin component as a solute or dispersoid together with the resin components. Applicable resin components include those enumerated above with respect to the hole-injecting/transporting layer.

The protective layer can be of any material that prevents substances which may accelerate deterioration of the device, such as moisture and oxygen, from entering the device. Such materials include metals, such as, In, Sn, Pb, Au, Cu, Ag, Al, Ti, and Ni; metal oxides, such as, MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$, and $CaF_2$; nitrides such as $SiN_x$ and $SiO_xN_y$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, copolymer copolymerized tetrafluoroethylene with monomer mixtures containing at least one kind of comonomer, fluorine-containing copolymers having a cyclic structure in the main chain thereof; water absorbing substances having a water absorption of at least 1%; and moisture-proof substances having a water absorption of 0.1% or less.

Methods of forming the protective layer include, but are not limited to, vacuum evaporation, sputtering, reactive sputtering, MBE (molecular beam epitaxy), cluster ion beam-assisted deposition, ion plating, plasma polymerization (radiofrequency-excited ion plating), plasma-enhanced CVD, laser-assisted CVD, thermal CVD, gas source CVD, coating techniques, printing, and transfer.

EXAMPLES

The present invention will now be illustrated in greater detail with reference to Examples, but it should be understood that the present invention should not be deemed to be limited thereto.

Example 1

A cleaned ITO substrate was set in a vacuum deposition apparatus. N,N'-diphenyl-N,N'-di(m-tolyl)benzidine (TPD) was deposited on the substrate to a thickness of 50 nm to form a hole-transporting layer. Then, a compound A (host material, $T_1$=65 kcal/mol) represented by the following chemical formula and a compound D (fluorescent light-emitting compound) represented by the following chemical formula were deposited thereon in a ratio of 99:1 (mass ratio) to a deposition thickness of 1 nm. Compound A and the compound (1-2) (the phosphorescent maximum wavelength of a solution system was 470 nm at 20° C.) as the amplifying agent were deposited thereon in a ratio of 17:1 (mass ratio) to a deposition thickness of 1 nm. This process was repeated 18 times, and a thin film (light-emitting layer) of 36 nm in total was formed. In this case, a crucible in which compound A and compound D had been poured and a crucible in which compound A and compound (1-2) had been poured were heated to temperatures at which the crucibles could be constantly deposited. Deposition was repeated by the switching of a shutter set in the vicinity of the crucible.

A compound B (non-complex compound, $T_1$=68 kcal/mol) represented by the following chemical formula was deposited on the light-emitting layer to a deposition thickness of 36 nm to form an electron-transporting layer. A pattern mask (having a pattern giving a light-emitting area of 4 mm by 5 mm) was put on the electron-transporting layer thus formed, and lithium fluoride was deposited to a thickness of 3 nm. Finally, aluminium was deposited to a thickness of 200 nm to form a cathode. Thereby an organic electroluminescent device was produced.

On applying a constant DC voltage to the resulting EL device by the use of Source-Measure Unit Model 2400 (trade name, manufactured by Toyo Corp.), light emission was obtained and, luminance was measured with a luminance meter BM-8 (trade name, manufactured by Topcon). As a result, blue light emission having a maximum light-emitting wavelength of 500 nm or less was obtained, and the external quantum efficiency at 200 $cd/m^2$ was 3.2%.

Example 2

In the places of compound A and the compound (1-2) used in Example 1, compound C (host material, $T_1$=67 kcal/mol) represented by the following chemical formula and compound (1-3) (the phosphorescent maximum wavelength of a solution system was 466 nm (20° C.)) were respectively used. Otherwise, a device was fabricated and tested in the same manner as in Example 1. As a result, blue light emission having a maximum light-emitting wavelength of 500 nm or less was obtained, and the external quantum efficiency at 200 $cd/m^2$ was 3.3%.

Example 3

In the places of compound A and compound (1-2) used in Example 1, compound C and compound (1-4) (the phosphorescent maximum wavelength of a solution system was 459 nm (20° C.)) were respectively used. Otherwise, a device was fabricated and tested in the same manner as in Example 1. As a result, blue light emission having a maximum light-emitting wavelength of 500 nm or less was obtained, and the external quantum efficiency at 200 $cd/m^2$ was 3.6%.

Example 4

In the place of compound (1-2) in Example 1, compound (1-21) was used. Otherwise, the device was fabricated and tested in the same manner as in Example 1. As a result, blue light emission having a maximum light-emitting wavelength of 500 nm or less was obtained, and the external quantum efficiency at 200 $cd/m^2$ was 3.4%.

Compound A

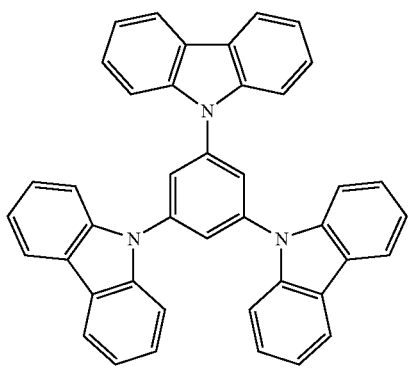

Compound B

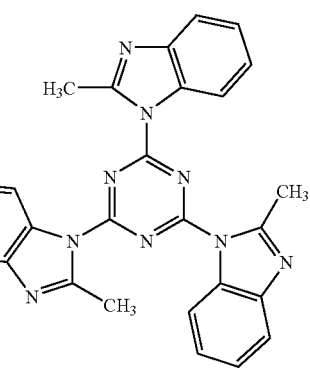

Compound C

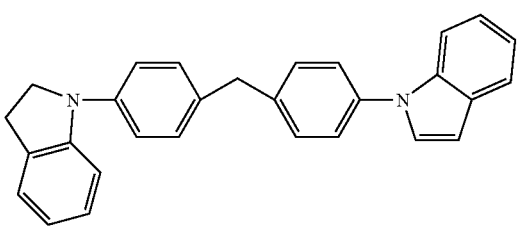

Compound D

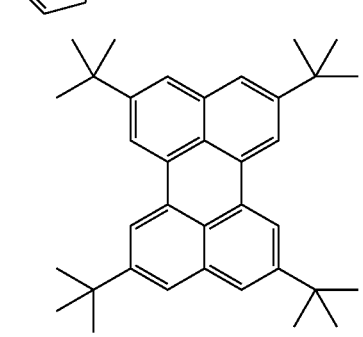

Comparative Example 1

A cleaned ITO substrate was set in a vacuum deposition apparatus. N,N'-diphenyl-N,N'-di(m-tolyl)benzidine (TPD) was deposited on the substrate to a thickness of 60 nm. Then, CBP ($T_1$=60 kcal/mol) and DCM2 represented by the following chemical formula were deposited on thereon at a ratio of 99:1 (mass ratio) to a deposition thickness of 1 nm. CBP and Ir(ppy)$_3$ represented by the following chemical formula were deposited thereon at a ratio of 90:10 (mass ratio) to a deposition thickness of 1 nm. The process was repeated 5 times, and an alternate laminated film of 10 nm in total was formed in 10 layers.

Then, BCP ($T_1$=58 kcal/mol) represented by the following chemical formula was deposited thereon to a deposition thickness of 20 nm. Then, Alq$_3$ was deposited thereon to a deposition thickness of 30 nm. A pattern mask (having a pattern giving a light-emitting area of 4 mm by 5 mm) was put on the organic thin film which had been thus formed, and magnesium and silver were deposited at a ratio of 25:1 (mass ratio) to a thickness of 100 nm in a vacuum evaporation apparatus. Finally, silver was deposited to a thickness of 50 nm.

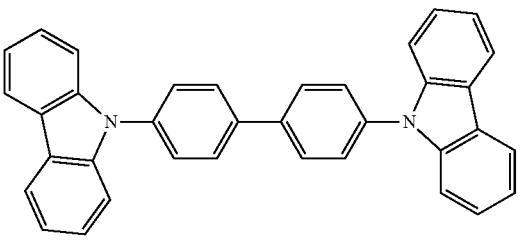

CBP

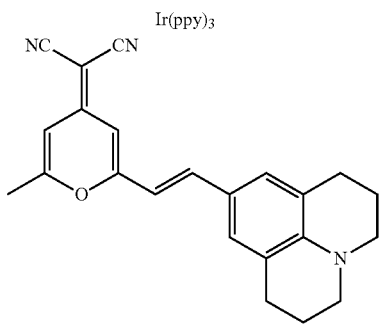

Ir(ppy)$_3$

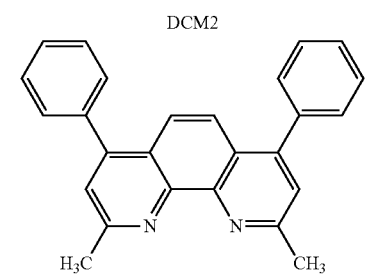

DCM2

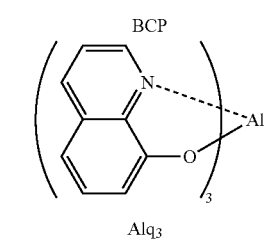

BCP

Alq$_3$

By applying a constant DC voltage to the resulting EL device with a Source-Measure Unit Model 2400 (trade name, manufactured by Toyo Corp.), red light emission having a maximum light-emitting wavelength of 590 nm was obtained and luminance was measured with a luminance meter BM-8 (trade name, manufactured by Topcon). The external quantum efficiency at a maximum luminance of 200 cd/m$^2$ was 2.6%. Further, in the light emission spectrum, light emission from Ir (ppy)$_3$ and light emission from CBP were mixed with the light emission from DCM2 (with the same result as in WO01/008230).

As described above, it was evident that the organic electroluminescent devices of Examples 1 to 4 have a higher degree of light-emitting efficiency than that of Comparative Example 1, and that they can produce emission of blue light. A similar effects can be achieved even when the structure described in Examples is applied in an appropriate manner to other devices or elements.

The invention claimed is:

1. An organic electroluminescent device having at least one organic compound layer containing a light-emitting layer between an anode and a cathode, wherein the organic compound layer contains a hole-transporting layer, a light-emitting layer and an electron-transporting layer, the light-emitting layer comprises a laminated structure formed by alternately laminating a layer containing at least one kind of fluorescent light-emitting compound emitting a fluorescent light at a time that voltage is applied and another layer containing at least one kind of amplifying agent, and a phosphorescent light-emitting maximum wavelength of the amplifying agent is equal to or less than 500 nm, and light emission at a time that voltage is applied to the device comprises mainly the fluorescent light emitted from the fluorescent light-emitting compound, wherein the laminated structure comprises at least four layers and at least one kind of the amplifying agent is represented by the following formula (1):

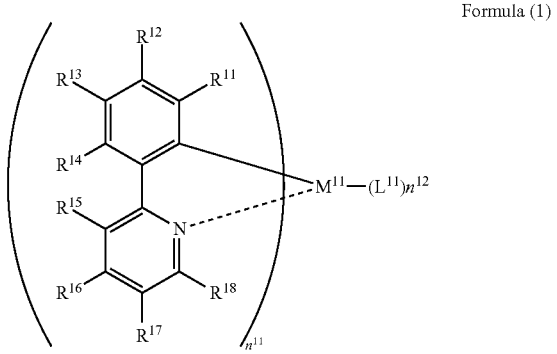

Formula (1)

wherein $R^{11}$ to $R^{18}$ each represents a hydrogen atom or a substituent; $L^{11}$ represents a ligand; $M^{11}$ represents a transition metal ion; and $n^{11}$ is an integer of 1 to 3; $n^{12}$ is an integer of 0 to 4; and at least one of $R^{12}$ and $R^{14}$ is a fluorine atom, and wherein a light-emitting maximum wavelength from the fluorescent light-emitting compound is 500 nm or less.

2. The organic electroluminescent device of claim 1, wherein the amplifying agent is capable of amplifying a number of singlet excitons generated at a time that voltage is applied, thus amplifying the intensity of the light emission at a time that voltage is applied.

3. The organic electroluminescent device according to claim 1, wherein a light-emitting layer contains at least one kind of host material, and a $T_1$ level of the host material (an energy level of a lowest excitation triplet state) is within a range of from 60 kcal/mol to 90 kcal/mol.

4. The organic electroluminescent device according to claim 1, wherein a $T_1$ level of at least one layer formed between the light-emitting layer and the cathode is within a range of from 60 kcal/mol to 90 kcal/mol.

5. The organic electroluminescent device according to claim 1, wherein the $T_1$ level of at least one layer formed between the light-emitting layer and the anode is within a range of from 60 kcal/mol to 90 kcal/mol.

6. The organic electroluminescent device of claim 1, wherein $R^{13}$ is a substituent.

7. The organic electroluminescent device of claim 1, wherein $R^{16}$ is a substituent.

8. The organic electroluminescent device according to claim 1, wherein $M^{11}$ is an iridium ion.

9. The organic electroluminescent device according to claim 1, wherein $M^{11}$ is a platinum ion.

10. The organic electroluminescent device according to claim 1, wherein the fluorescent light-emitting compound is a fused aromatic compound.

11. The organic electroluminescent device according to claim 1, wherein the organic compound layer contains an electron-transporting layer including a non-complex compound.

12. The organic electroluminescent device according to claim 1, wherein $R^{12}$ and $R^{14}$ each represents a fluorine atom, $M^{11}$ represents an iridium ion, $n^{11}$ represents an integer of 2, and $L^{11}$ represents a nitrogen-containing heterocyclic ligand, a diketone ligand or a carboxylic ligand.

13. The organic electroluminescent device according to claim 12, wherein $L^{11}$ represents a bidentate nitrogen-containing heterocyclic ligand.

14. The organic electroluminescent device according to claim 13, wherein the bidentate nitrogen-containing heterocyclic ligand is a ligand having pyridine, pyrazine, pyrimidine, pyridazine, pyrrole, pyrazole, imidazole, triazole, oxazole, thiazole, oxadiazole or thiadiazole.

15. The organic electroluminescent device according to claim 14, wherein the bidentate nitrogen-containing heterocyclic ligand is a ligand having pyridine or pyrazole.

16. The organic electroluminescent device according to claim 15, wherein the fluorescent light-emitting compound is a perylene.

17. The organic electroluminescent device according to claim 1, wherein $R^{12}$ and $R^{14}$ each represents a fluorine atom, $M^{11}$ represents an iridium ion, $n^{11}$ represents an integer of 3, and $n^{12}$ represents an integer of 0.

18. The organic electroluminescent device according to claim 17, wherein the fluorescent light-emitting compound is 2, 5, 8, 11-tetra(tert-butyl)perylene.

19. The organic electroluminescent device according to claim 1, wherein at least 90% of the light-emission of the device is the fluorescent light emitted from the fluorescent light-emitting compound.

20. The organic electroluminescent device according to claim 1, wherein the laminated structure has at least four layers formed by alternately laminating a layer containing at least one kind of fluorescent light-emitting compound emitting a fluorescent light when voltage is applied and another layer containing at least one kind of amplifying agent.

21. The organic electroluminescent device according to claim 1, wherein a light-emitting maximum wavelength of the fluorescent light-emitting compound is equal to or less than 500 nm.

22. The organic electroluminescent device according to claim 1, wherein at the least one kind of the amplifying agent is selected from the group consisting of
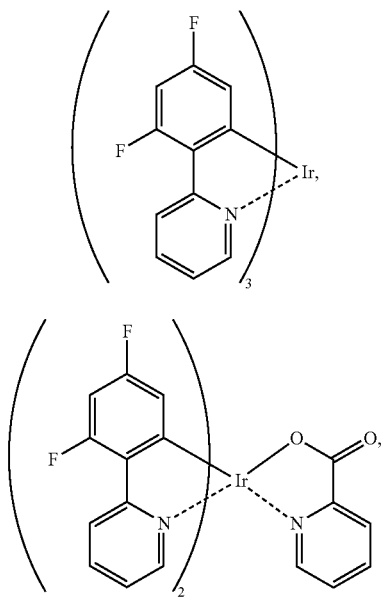
(1-2)
(1-3)
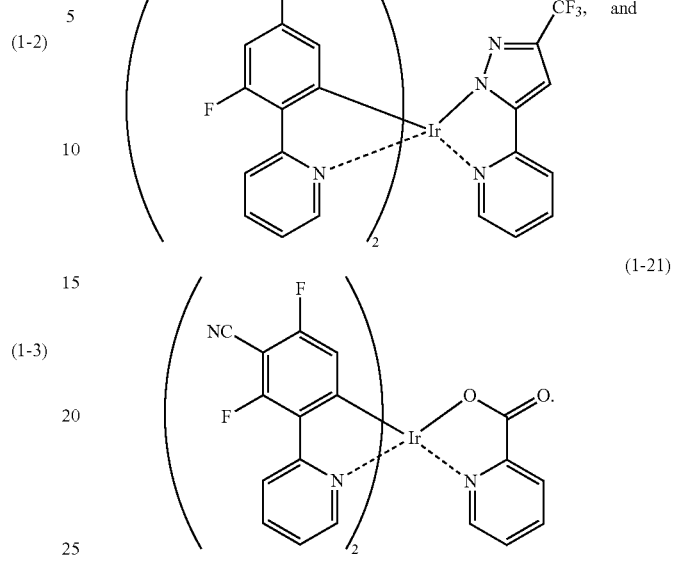
(1-4)
(1-21)
* * * * *